United States Patent [19]
Taylor et al.

[11] 4,089,034
[45] May 9, 1978

[54] MACHINE AND METHOD FOR POLING FILMS OF PYROELECTRIC AND PIEZOELECTRIC MATERIAL

[75] Inventors: Allen L. Taylor, Woodbury; William F. Sheffield, Oakdale, both of Minn.

[73] Assignee: Minnesota Mining and Manufacturing Company, St. Paul, Minn.

[21] Appl. No.: 681,891

[22] Filed: Apr. 30, 1976

[51] Int. Cl.$^2$ ............................. H05F 1/02; H05F 3/02
[52] U.S. Cl. ...................................... 361/233; 29/25.42
[58] Field of Search ...................... 317/262 A, 262 E; 307/88 ET, 70; 29/592, 592 E, 25.42, 573; 264/2; 361/233, 234

[56] References Cited

U.S. PATENT DOCUMENTS

| | | | |
|---|---|---|---|
| 3,360,661 | 12/1967 | Ogawa | 307/70 |
| 3,521,126 | 7/1970 | Granzow et al. | 317/262 A |
| 3,671,806 | 6/1972 | Whitmore et al. | 317/262 A |
| 3,878,274 | 4/1975 | Murayama et al. | 264/2 |
| 3,885,301 | 5/1975 | Murayama | 307/88 ET |
| 3,963,488 | 6/1976 | Brushenko | 317/262 A |

OTHER PUBLICATIONS

*Applied Physics Letters* vol. 24, No. 10, May 15, 1974, pp. 456-458.
"Pyroelectricity in PVF"; *Journal of Applied Physics* vol. 44, No. 5, May 1973, pp. 2064-2071.
*Journal of Polymer Science* vol. 13, May 1975, pp. 1033-1047, "Persistent Polarization in PVF".
*Applied Physics Letters* vol. 28, No. 5, Mar. 1976, pp. 250-252.

*Primary Examiner*—Gerald Goldberg
*Attorney, Agent, or Firm*—Cruzan Alexander; Donald M. Sell; Walter N. Kirn

[57] ABSTRACT

An apparatus and method for rapidly and continuously poling a film of polymeric material exhibiting at least one of pyroelectric and piezoelectric characteristics to yield a poled film having a high coefficient of at least one of pyroelectric and piezoelectric properties, and a high degree of uniformity of polarization throughout its thickness. The method of the present invention includes applying a plurality of time-spaced electric field pulses across a portion of the film. The apparatus of the present invention includes a drive for advancing the film and a pair of electrodes that establish an electric field across the film. A hot poling roller serves as a high voltage electrode and a grounded roller contacts a conductive layer coated on the other side of the film. A voltage source and a switch coact to apply a plurality of time-spaced electric field pulses between the two electrodes. The width of each pulse is less than the time a portion of the film is under the influence of the electric field established by the two electrodes. The high voltage electrode is separated from direct physical contact with the film by a resistive layer in order to avoid serious damage to the film due to electrical arcing that can occur through a defective or thinner than normal area of the film.

36 Claims, 6 Drawing Figures

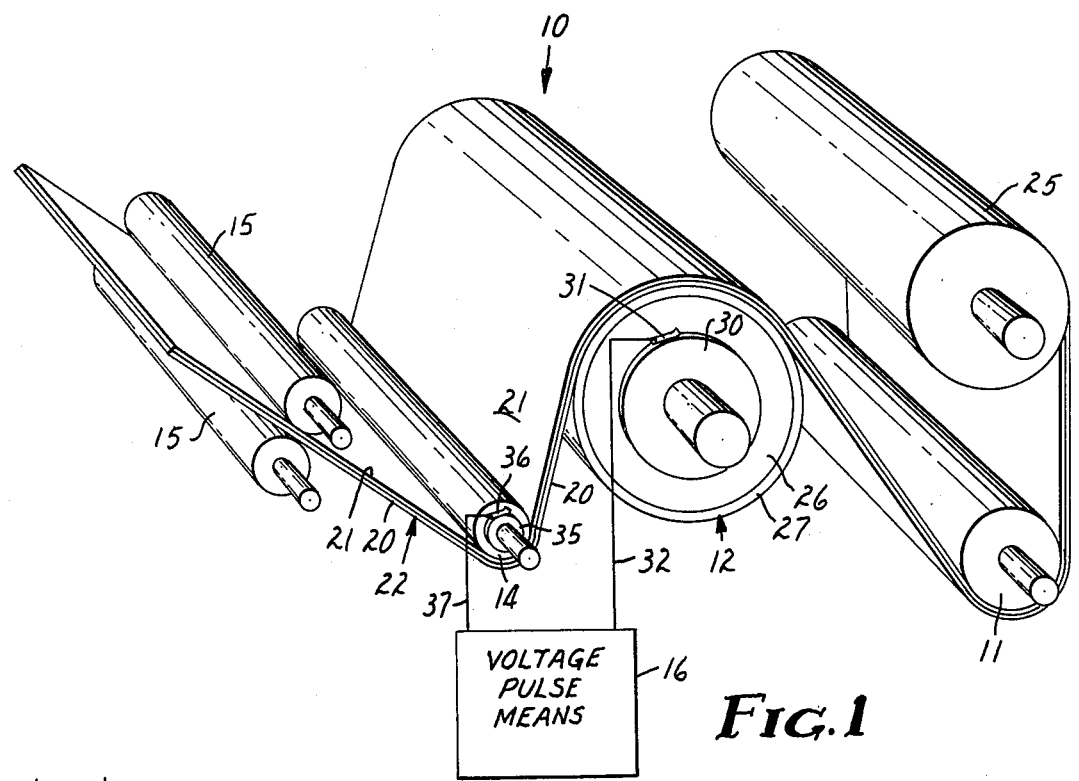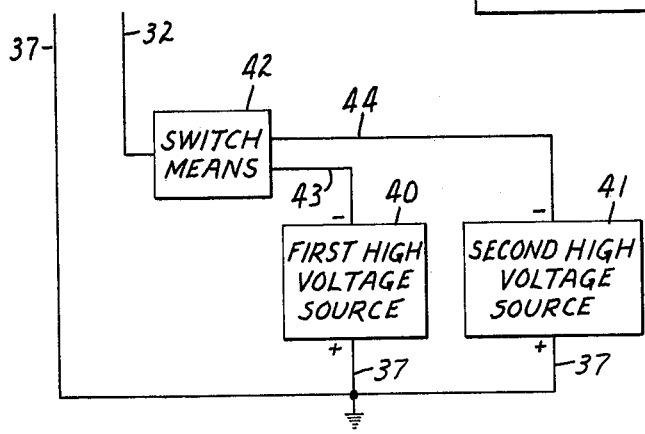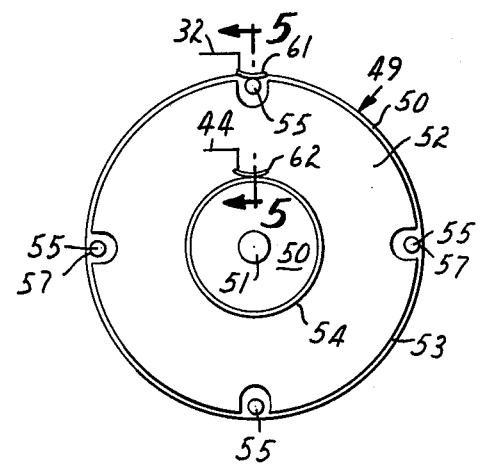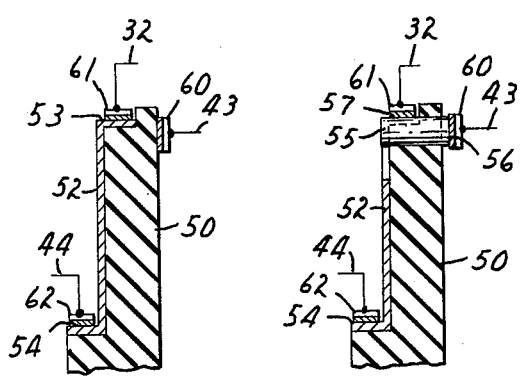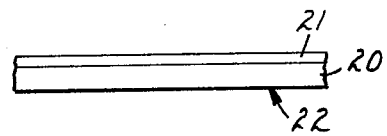

MACHINE AND METHOD FOR POLING FILMS OF PYROELECTRIC AND PIEZOELECTRIC MATERIAL

BACKGROUND OF THE INVENTION

1. Field of the Invention

The present invention relates in general to the poling of polymeric film materials that exhibit at least one of pyroelectric and piezoelectric properties, and in one aspect relates to the continuous poling of such film materials.

2. Description of the Related Art

Several polymeric film materials exhibit both pyroelectric and piezoelectric properties. However, some polymeric film materials may exhibit only one of such properties.

The pyroelectric and/or piezoelectric property of polymeric film materials is commonly referred to as being caused by an arrangement of the dipoles of the film. Normally the dipoles of pyroelectric and/or piezoelectric polymeric films are essentially arranged in random fashion. However, such randomly arranged dipoles can be rearranged into a poled orientation by heating the film above a particular temperature, known as the poling temperature, and concurrently applying an electric field across the film. Once the film is poled and cooled below the poling temperature, the electric field may be removed and the dipoles will remain substantially as oriented by the field to yield film with desirable pyroelectric and/or piezoelectric properties. However, if the poled film is again heated above its poling temperature for an extended period thereafter, the dipoles will return to substantially random orientation.

It is generally known that the degree of dipole orientation that results from such a poling process is a function of the temperature to which the film is heated, the magnitude of the applied electric field and the length of time such electric field is applied while the film is heated above the poling temperature. For example, substantial poling occurs in a film of polyvinylidene fluoride when it is heated to a temperature of 90° C and an electric field of 400 K volts/cm. is applied across the film for 10 minutes. In general terms, increasing the temperature, the electric field magnitude, and/or the poling time will progressively increase the degree of poling achieved up to a maximum.

The art describes poling of pyroelectric and/or piezoelectric films in non-continuous modes. For example, U.S. Pat. No. 3,878,274 indicates that polyvinylidene fluoride film can be poled by placing electric fields of 50 K volts/cm. to 2000 K volts/cm. across the film at temperatures between 40° C and 150° C. However, such patent contains no detailed teaching of the particular magnitude of electric field that is used at a particular temperature. Accordingly, since the electric field strength that films can stand without breakdown and arcing therethrough is directly related to the temperature of the sheet of film being poled, it is not apparent from such patent how to create an improved apparatus and/or process for poling. The examples given in the U.S. Pat. No. 3,875,274 pole at 700 K volts/cm. at 90° C for 30 minutes, 400 K volts/cm. at 90° C for 30 minutes, and 200 K volts/cm. at 150° C for apparently 30 minutes also.

An Applied Physics Letters article entitled "Effects of Poling Conditions on Responsivity and Uniformity of Polarization of $PVF_2$ Pyroelectric Detectors" (Vol. 24; No. 10; May 15, 1974) indicates that the uniformity of polarization through the thickness of polyvinylidene fluoride ($PVF_2$) film material is related to the responsivity of the poled material. The article also points out that very uniformly poled material can be obtained by poling at 2100 K volts/cm. at 70° C for 5 minutes, but does not indicate the rate of material breakdown experienced. Furthermore, the article states that increased temperature and voltage tend to make polarization more uniform; and that increased poling time likewise tends to make polarization more uniform.

Other art has indicated poling results for short periods of time in the seconds range and compared this data to data for longer periods of time in the several minutes range using the same poling temperature and electric field magnitude. A Journal of Applied Physics article entitled "Pyroelectricity in Polyvinylidene Fluoride" (Vol. 44; No. 5; May, 1973) indicates in FIG. 10 that the magnitude of polarization achieved by the use of short poling periods is only a fraction of the magnitude achieved for long poling periods. A Journal of Polymer Science article entitled "Persistent Polarization in Polyvinylidene Fluoride" (Vol. 13; 1975; pp. 1033–1047) indicates similar findings.

SUMMARY OF THE INVENTION

The present invention provides an apparatus and process for poling a film of polymeric material in short periods of time to yield a high coefficient of at least one of pyroelectric and piezoelectric properties, and a high degree of uniformity of polarization through the thickness of the material. Such results are obtained according to the present invention by applying a plurality of time-spaced electric field pulses across the thickness of the film.

A poling apparatus according to the present invention includes a first means for applying a first electric potential to one side of the film and a second means for applying a second electric potential to the opposite side of the film. The first and second means establish and electric field across a portion of the film for providing moderate coefficients of at least one of pyroelectric and piezoelectric properties in such portion. A drive means continuously advances the film past the first and second electric potential means. A third means is operatively connected to the first and second electric potential means and provides a plurality of time-spaced electric field pulses for application across the film as it is advanced through the apparatus by the drive means. Each of the time-spaced electric field pulses has a width less than the time a portion of the film is under the influence of the electric field established by the first and second electric potential means.

Preferably, the present invention utilizes at least four electric field pulses and often at least 10 pulses. The width of the pulses are generally less than 5 seconds preferably less than 2 seconds and often less than 500 milliseconds or 100 milliseconds. The magnitudes of the pulses are preferably greater than 1500 K volts/cm. across the film and often greater than 2500 K volts/cm. across the film. Such pulse magnitudes represent the total electric field across the film during the pulses. Preferably, a bias electric field less than the magnitude of the pulses is across the film between pulses. Such bias electric field is often less than 2400 K volts/cm. or less than 2000 K volts/cm. Preferably, the above parameters are combined such that the present invention utilizes at least four pulses each of which have a width less than 500 milliseconds and a maximum magnitude greater than 2500 K volts/cm.

Moderate coefficients of pyroelectric and piezoelectric properties according to the present invention are those that are at least 50 percent of the maximum obtainable by steady state poling. Such maximum obtainable by steady state poling is defined as the typical maximum coefficient of pyroelectric and piezoelectric properties obtained for a similar piece of the same film material and is determined by coating a conductive electrode on each side of the film and then placing a constant electric field magnitude across the thickness of the film for 60 minutes. The magnitude of the constant electric field during the steady state poling should be near the dielectric breakdown strength of the film for 60 minutes and the film should be at the same temperature as the film poled according to the present invention.

Preferably, the present invention provides considerable coefficients of at least one of the pyroelectric and piezoelectric properties; and more preferably, the present invention provides substantial coefficients of at least one of the pyroelectric and piezoelectric properties. Considerable and substantial coefficients of poling are respectively defined as being at least 70 percent and at least 90 percent of the maximum obtainable by steady state poling. Material poled according to the present invention, however, often has a poling coefficient greater than 100 percent of the maximum obtainable by steady state poling.

The preferred embodiment of the present invention includes a current limiting means that is carried on the second electric potential means such that it is located between the second electric potential means and the adjacent side of the film. Such current limiting means limits the damage due to electrical arcing that may occur should the film dielectrically break down.

By utilizing electric field pulses having a short pulse width and a large magnitude across the film, the present invention can provide more desirable poling results, such as an increase in poling coefficient and uniformity of poling. Relatively speaking, a shorter pulse width permits a higher magnitude of electric field to be placed across the film without dielectric breakdown. It is believed that these higher magnitudes of electric fields cause higher forces on the components of the material that cause the pyroelectric and piezoelectric properties in the film. A copending application filed this same day U.S. Application Ser. No. 681,895 in which one of the present inventors is the applicant describes an apparatus and method for poling utilizing a high electric field for a singular short period of time. The present invention provides for a plurality of rather short, high force pulses in a time-spaced relationship to pole the material in very short periods of time. In general, the shorter the pulse width the higher the electric field that can be used. However, as the pulse width gets short, it may require and it is preferable to apply a plurality of pulses to pole the material. A lower level bias electric field may be applied between such pulses.

Optimization of the degree of poling according to the present invention appears to involve the interrelationship of pulse width, pulse magnitude, number of pulses, bias electric field magnitude and temperature of the film. Relatively speaking, over some range of temperatures the same pyroelectric or piezoelectric coefficient can be obtained by raising the temperature of the film and using lower electric field magnitudes for the same period of time. It is believed that individually raising the temperature of the film, increasing the pulse width, increasing the magnitude of the pulses, increasing the bias electric field between pulses and increasing the number of pulses will tend to increase the magnitude of poling up to a saturation level. However, these parameters in combination are also related to the dielectric strength at which the film customarily breaks down. It therefore follows that more desirable poling should result as these parameters are varied in combination to the point of approaching dielectric breakdown of the material. In general, good poling has resulted by utilizing at least four pulses each having a pulse width less than 50 milliseconds.

As previously described, film temperature is one of the parameters which can be varied. Therefore, the preferred embodiment of the present invention also includes apparatus that provides heat for concurrently raising the temperature of at least a segment of the portion of the film while the electric field pulses are across such portion. Such feature is not essential to the present invention, however, as the film can be poled at room temperature.

In the preferred embodiment, the first electric potential means is provided by a cylindrical roller having a grounded electrically conductive surface adapted for contacting a layer of conductive material carried on one side of the film. The second electric potential means is provided by a temperature controlled cylindrical roller having an electrically conductive surface on which there is a current limiting layer that contacts the opposite side of the film. The third means includes a mechanical switch that alternately applies first and second high voltage sources to the cylindrical rollers of the first and second electric potential means to provide the plurality of time-spaced electric field pulses across the film.

BRIEF DESCRIPTION OF THE DRAWINGS

FIG. 1 is a perspective view of a poling machine according to the present invention through which a coated sheet of polymeric film is disposed;

FIG. 2 is an enlarged fragmentary cross-sectional view of the coated film of FIG. 1;

FIG. 3 is a block diagram of the means for providing a plurality of time-spaced electric field pulses of FIG. 1;

FIG. 4 is a front view of the switch means of FIG. 3;

FIG. 5 is a fragmentary cross-sectional view of the switch means of FIG. 4 taken along the line 5—5; and FIG. 6 is a fragmentary cross-sectional view of the switch means of FIG. 4 taken along the line 5—5 with the rotating member of the switch means rotated through 45°.

DESCRIPTION OF THE PREFERRED EMBODIMENTS

Referring now to FIG. 1, the present invention is shown in the form of a poling machine 10. The machine 10 includes a preheat roller 11, a hot poling roller member 12, an electrically grounded roller 14 and a pair of drive rollers 15, all of which rollers are cylindrical in shape and mounted from side plates (not shown) of the machine. The machine 10 also includes a voltage pulse means 16 that provides a plurality of time-spaced pulses and is electrically connected to the hot poling roller member 12 and the electrically grounded roller 14. The poling machine 10 is adapted for poling a film 20 of polymeric material that can be poled to provide at least one of pyroelectric and piezoelectric properties, is highly electrically insulative and, as most clearly illustrated in FIG. 2, is coated on one side with a relatively thin layer of electrically and thermally conductive material 21 such as aluminum, nickel or copper to form a composite sheet of film 22.

Referring back to FIG. 1, the composite sheet of film 22 is supplied to the machine 10 from a supply roll 25 and is threaded partially around the rollers 11, 12 and 14 and then through a nip between the drive rollers 15, which drive rollers serve as a drive means to advance the sheet 22 through the machine 10. A portion of the conductive layer 21 of the sheet 22 is maintained in physical contact with the roller 14 which has an electrically grounded conductive surface adapted for contacting a portion of the surface of the conductive layer 21 to effectively electrically ground the entire broad surface of the side of the film 20 carrying the layer 21. Thus, the roller 14 provides a first means for applying a first electric potential to one side of the film 20.

To more fully understand the operation of the present invention and the manner in which the film is poled, the following description is made with regard to a reference portion of the composite sheet 22 as such portion is advanced through the machine 10. Upon leaving the supply roll 25 the reference portion of the sheet 22 first partially winds around the preheat roller 11 such that the conductive layer 21 contacts the roller 11. The preheat roller 11 is heated, either electrically or in some other manner, to a temperature preferably over 120° C and is employed together with film tension for eliminating wrinkles in the sheet 22 to provide good poling along the length of the film 20. While the preheat roller 11 is not essential to the operation of the machine, elimination of wrinkles is very desirable. To further aid in controlling wrinkles in the sheet 22, additional film handling rollers (not shown) and drag brakes (not shown) may be used with the supply roll 25 to subject the sheet 22 to a predetermined desired tension.

Subsequent to leaving contact with the preheat roller 11, the reference portion of the sheet 22 moves to the hot poling roller member 12 and the exposed surface of the film 20 of the sheet 22 engages the outer cylindrical surface thereof. The member 12 includes an inner cylindrical roller 26 that is heated, either electrically or in some other manner, and has an electrically conductive surface. A current limiting electrically resistive layer 27 overlays the cylindrical roller 26 of the member 12 and the film 20 rides over the layer 27 as the sheet 22 advances around the periphery of the member 12.

The electrically conductive surface of the cylindrical roller 26 serves the dual functions of heating the reference portion of the film 20 and acting as a second means for applying a second electric potential to the film 20 to thereby coact with the first electric potential means to establish an electric field across a portion of the film 20 to provide moderate coefficients of at least one of pyroelectric and piezoelectric properties in the film.

The conductive surfaces of rollers 26 and 14 are electrically connected to the voltage pulse means 16 as follows. The conductive surface of rotating roller 26 is electrically connected to an associated rotating slip ring 30. A slip ring contact 31, fixedly mounted to a side plate (not shown) of the machine 10, rides on slip ring 30 and is electrically connected to the voltage pulse means 16 via a conductor 32. In a similar manner, the conductive surface of rotating roller 14 is electrically connected to the voltage pulse means 16 via a slip ring 35, a slip ring contact 36, and a conductor 37. The slip ring 30, contact 31 and conductor 32 are part of the second electric potential means; and the slip ring 35, contact 36 and conductor 37 are part of the first electric potential means.

The resistive layer 27 of the hot poling roller member 12 reduces the possibility for damage to the film 20 due to arcing therethrough resulting from a film defect or an area of film 20 that is thinner than normal. The layer 27 is preferable formed from elastomeric materials such as silicone rubber, but ceramic materials could also be employed. As such, the layer 27 provides a current limiting means between the first and second electric potential means in the form of an electrical resistance between such electrodes should the dielectric strength of any area of the film 20 be exceeded by the electric field previously described. Such resistance significantly aids in reducing damage to the film which would otherwise be caused by the energy dissipated by arcing through the film. However, the electrical resistance and capacitance of the layer 27 is selected such that, when combined with the dielectric resistance and capacitance of the film 20, the layer 27 will not interfere with the normal poling process.

When the reference portion of the sheet 22 leaves the hot poling roller member 12, it passes to the grounded roller 14 through the ambient air and is cooled by such air below the poling temperature while the dipoles are substantially held in alignment. It is believed that no special cooling means are necessary because the sheet 22 moves so rapidly away from the heat generated by the poling roller 26 that the reference portion of the film 20 is cooled below the poling temperature before the dipoles move out of alignment.

Thereafter, the reference portion of the poled sheet 22 passes around the electrically grounded roller 14 and between the drive rollers 15 to take-up roller (not shown). The drive rollers 15 continuously advance the composite sheet 22 through the machine 10. Thus, they control the speed of the sheet and the length of time the reference portion thereof is under the influence of the electric field established by the rollers 14 and 26.

The voltage pulse means 16 serves as a third means and is electrically connected to the roller 14 (first means) and the roller 26 (second means). Voltage pulse means 16 provides electric potentials to the rollers 14 and 26 to establish a plurality of time-spaced electric field pulses across the film. As shown in FIG. 3, voltage pulse means 16 includes a first high voltage source 40, a second high voltage source 41 and a switch means 42. The first high voltage source is connected to switch means 42 via a conductor 43, and the second high voltage source is connected to switch means 42 via a conductor 44. Each of the sources 40 and 41 has a steady state magnitude and the magnitude of source 40 is greater than that of source 41. The switch means 42 alternately connects the first source 40 and the second source 41 between the conductors 37 and 32, which conductors are respectively part of the first and second electric potential means. The first source 40, in conjunction with switch means 42 provides the time-spaced electric field pulses; and the second source 41 in conjunction with switch means 42 provides a lower magnitude bias electric field between the time-spaced pulses.

As shown in FIGS. 4, 5 and 6, the switch means 42 includes a rotary member 49 that has an insulative portion 50 and an axle 51. A conductive plate 52 is mounted on the insulative portion 50 and has contact surfaces 53 and 54. A plurality of conductive pins 55 are inserted through the insulative portion 50 and each such pin has contact surfaces 56 and 57. The switch means also includes three generally stationary contacts 60, 61 and 62 that are respectively connected to conductors 43, 32 and 44.

FIGS. 4 and 5 show the switch means in a first position wherein conductor 43 from the first high voltage source 40 is connected to conductor 32. Conductor 43 connects to stationary contact 60. Stationary contact 60 is in contact with contact surface 56 of pin 55; and contact surface 57 of pin 55 is in contact with stationary contact 61. Stationary contact 61 is connected to conductor 32. As the member 49 having the insulative portion 50, plate 52, and pins 55 is rotated about its axle 51, the stationary contacts 60 and 61 make and break with the pin 55 to apply a short pulse of voltage from source 40 to the lead 32.

FIG. 6 shows the switch means in a second position wherein conductor 44 from the second high voltage source 41 is connected to conductor 32. FIG. 6 represents a sectional view along line 5—5 of FIG. 4 except the member 49 has been rotated 45° on its axle 51. In FIG. 6, conductor 44 connects to stationary contact 62. Stationary contact 62 is in contact with contact surface 54 of conductive plate 52; and contact surface 53 of plate 52 is in contact with stationary contact 61. Stationary contact 61 is in contact with conductor 32 as previously described. Thus, as the member 49 is rotated about its axle 51, stationary contact 62 is continuously in contact with surface 54, and stationary contact 61 makes and breaks with contact surface 53 to apply a bias voltage from source 41 to the lead 32. The pins 55 and plate 52 are sufficiently spaced from one another to prevent contact 61 from shorting them together as member 49 rotates.

Thus, the switch means alternately connects the first and second high voltage sources 40 and 41 between the rollers 14 and 26. The source 40 provides a brief electric field pulse and the source 41 provides a lower magnitude bias level electric field between such pulses. The lower level bias electric field is optional, but preferred, according to the present invention. The film is moved through the machine 10 by the drive rollers 15 at a speed such that the width of each pulse is less than the time a portion of the film is under the influence of the electric field established by the first and second electric potential means.

While the preferred embodiment of the present invention illustrates a continuous poling process, the concept of the invention is also applicable to non-continuous poling processes where a sheet of polymeric film has a thin conductive layer (electrode) on each of its broad surfaces. For the non-continuous process, such pulses should be less than 5 seconds in width, have a spacing greater than 100 milliseconds and a maximum magnitude greater than 1500 K volts/cm. Preferably, the width of each pulse is less than 500 milliseconds, the spacing between pulses is greater than 500 milliseconds and the maximum magnitude of each pulse is greater than 2500 K volts/cm.

The following non-limiting example is provided:

EXAMPLE

A 25 micrometer thick, 305 millimeter wide film 20 of biaxially orientated polyvinylidene fluoride (obtained from Kureha Chemical Co., Japan) was vapor coated with an approximately 60 nanometer thick aluminum layer 21 on one side and then fed through the poling machine 10 shown in FIG. 1. The preheat roller 11 was 95 millimeters in diameter and its temperature was held at approximately 130° C. The hot poling roller 12 included an inner roller 26 that was 140 millimeters in diameter and heated to approximately 105° C. The roller 26 was coated with a layer 27 of conductive rubber approximately 3 millimeters thick having an electrical resistivity of approximately $10^{10}$ ohms-cm. The electrically grounded roller 14 was 25 millimeters in diameter and the drive rollers 15 were 50 millimeters in diameter.

The speed of the film, rotation rate of the switch means and the magnitudes of the first and second voltage sources were varied. The voltage across the film was measured by using ball bearing rollers that contacted the exposed surfaces of the rollers 12 and 14 and were connected to an oscilloscope. The electric field was calculated by dividing such voltage measurement by the thickness of the film.

Table I shows tabulations of pyroelectric coefficients and uniformity of polarization results obtained for film poled using various parameter combinations. A voltage produced by the pyroelectric effect was measured by increasing the temperature of the poled material, which now has a conductive coating on each broad surface, electrically shorting the broad surfaces together, decreasing the temperature of the poled material and then making a measurement of the voltage between the broad surfaces of the film. The pyroelectric coefficient is calculated by the formula $P = (K\epsilon_o/d)(V/\Delta T)$ where $P$ equals pyroelectric coefficient, $\epsilon_o$ equals permittivity of free space, $K$ equals dielectric constant of the film, $d$ equals thickness of the film, $V$ equals voltage measured, and $\Delta T$ equals temperature change of the film to produce V. It should be realized that the magnitude of pyroelectric coefficient measured will vary somewhat based upon the lot (batch) of material from which the film came.

The uniformity of polarization was determined by cyclically impinging 5 to 310 Hz energy upon first one surface and then the other surface of the film. First, the poled film was coated on each broad surface with an approximately 60 nanometer thick aluminum layer. One coated surface was exposed to an infrared lamp through a variable frequency mechanical light chopper that had a 50 percent duty cycle. The conductive layer facing the infrared source absorbed sufficient radiation to heat the film, thereby producing a pyroelectric signal that could be monitored with a high impedance amplifier. At low chopper frequencies such as 25 Hz the entire 25 micrometer thickness of the film was temperature cycled. At higher frequencies such as 200 Hz the part of the thickness of the film nearest the infrared source was temperature cycled more than the part of the thickness of the film farthest from the infrared source. A phase sensitive detector was connected to the output of the amplifier and the output voltage was measured. Data was taken with the infrared source incident on first one surface of the film and then later on the other surface of the film. Such multiple frequency data for each surface was normalized to the 25 Hz data point for that surface. The difference between the two normalized data points for each frequency (one for each side respectively) was divided by the average of the two normalized data points to provide a Percent Deviation of Responsivity as shown in Table I.

As previously described, at the higher frequencies, the part of the thickness of the film nearest the infrared source was temperature cycled more than the part of the thickness of the film farthest from the infrared source. If the film is uniformly poled throughout its thickness, at higher frequencies the normalized response for the same frequency data point on each side of the film will be the same. However, to the extent the film is non-uniformly poled, at higher frequencies the normalized response for the same frequency data point on each side of the film will deviate from each other. In general, the uniformity data indicates that short poling times lead to uniform polarization.

TABLE I

| Number of Pulses | Pulses Per Second | Total Time in Field (Seconds) | Pulse Width (Milli-seconds) | Pulse Magnitude (K volts /cm) | Bias Magnitude Between Pulses (K volts /cm) | Temperature of the Film (° C) | Pyroelectric Coefficient (nCoul/ cm² ° C) | % Deviation of Responsivity (Nonuniformity) | | | | |
|---|---|---|---|---|---|---|---|---|---|---|---|---|
| | | | | | | | | at 50 Hz | at 100 Hz | at 150 Hz | at 200 Hz | at 250 Hz |
| 32 | 4 | 8 | 35 | 2700 | 1900 | 120 | 2.46 | X | X | X | X | X |
| 32 | 4 | 8 | 35 | 2500 | 2300 | 120 | 2.43 | X | X | X | X | X |
| 32 | 4 | 8 | 35 | 2800 | 2300 | 120 | 2.53 | X | X | X | X | X |
| 4 | 4 | 0.9 | 35 | 2200 | 1500 | 120 | 2.26 | X | X | X | X | X |
| 4 | 4 | 0.9 | 35 | 2400 | 1800 | 120 | 2.37 | X | X | X | X | X |
| 4 | 4 | 0.9 | 35 | 2700 | 1800 | 120 | 2.52 | 0% | 3% | 3% | 1% | 3% |
| 4 | 4 | 0.9 | 35 | 2700 | 2200 | 120 | 2.51 | 0% | 0% | 3% | 3% | 4% |

X = no data taken

What is claimed is:

1. A poling apparatus for continuously processing a length of film of polymeric material to provide at least one of pyroelectric and piezoelectric properties in the film, comprising:
    a first means at a poling station for applying an electric potential to at least a portion of one broad surface of the film;
    a second means located at the poling station for coacting with said first means to establish an electric field across said portion of the film to provide moderate coefficients of at least one of said pyroelectric and piezoelectric properties in said portion;
    a drive means for continuously advancing the film past the poling station; and
    a third means electrically connected to said first and second means for providing electric potentials to said first and second means to establish a plurality of time-spaced electric field pulses across said portion of the film while it is advancing past the poling station, the width of each said pulse being less than the time said portion of the film is under the influence of the electrical field established by said first and second means.

2. A poling apparatus according to claim 1, wherein said third means comprises:
    a first high voltage source;
    a second high voltage source; and
    switch means for alternately connecting said first and second high voltage sources between said first and second means.

3. A poling apparatus according to claim 1, wherein the width of each said pulse provided by said third means is less than 2 seconds.

4. A poling apparatus according to claim 1, wherein the width of each said pulse provided by said third means is less than 500 milliseconds.

5. A poling apparatus according to claim 1, wherein the width of each said pulse provided by said third means is less than 100 milliseconds.

6. A poling apparatus according to claim 1, wherein said plurality of time-spaced electric field pulses provided by said third means is at least four in number.

7. A poling apparatus according to claim 1, wherein said plurality of pulses provided by said third means is at least 10 in number.

8. A poling apparatus according to claim 1, wherein said electric field pulses provided by said third means provide a magnitude greater than 1500 K volts/cm. across said film.

9. A poling apparatus according to claim 1, wherein said electric field pulses provided by said third means provide a magnitude greater than 2500 K volts/cm. across said film.

10. A poling apparatus according to claim 9, wherein the electric field provided by said third means in the time-space between said pulses is less than 2400 K volts/cm. across said film.

11. A poling apparatus according to claim 9, wherein the electric field provided by said third means in the time-space between said pulses is less than 2000 K volts/cm.

12. A poling apparatus according to claim 1, wherein said third means provides at least 4 pulses across said portion of the film, each pulse having a width less than 2 seconds and a maximum magnitude greater than 1500 K volts/cm.

13. A poling apparatus according to claim 1, wherein
    said first means includes a cylindrical roller having a grounded electrically conductive surface for contacting a layer of conductive material carried on said one surface of the film; and
    said second means includes a cylindrical roller having an electrically conductive surface.

14. A poling apparatus according to claim 13, further including a current limiting means that is carried on the surface of said cylindrical roller of the second means.

15. A poling apparatus according to claim 14, wherein said second means provides heat for raising the temperature of said portion during the time it is influenced by said electric field.

16. A poling apparatus according to claim 1, wherein said first and second means establish an electric field across said portion of the film to provide considerably coefficients of at least one of said pyroelectric and piezoelectric properties in said portion.

17. A poling apparatus according to claim 1, wherein said first and second means establish an electric field across said portion of the film to provide substantial coefficients of at least one of said pyroelectric and piezoelectric properties in said portion.

18. A process for continuously poling a film of polymeric material to provide at least one of pyroelectric and piezoelectric properties in the film, comprising:
    advancing said film past a poling station that includes a poling electrode;

applying a first electric potential to at least a portion of one broad surface of the film; and applying a second electric potential to said portion on the opposite broad surface of the film to establish an electric field having a plurality of time-spaced electric field pulses across said portion of the film while it is advancing past the poling station to provide moderate coefficients of at least one of said pyroelectric and piezoelectric properties in said portion, the width of each said pulse being less than the time said portion of the film is under the influence of the electric field established by said first and second electric potentials.

19. A continuous poling process according to claim 18, wherein the width of each said pulse across said portion of the film is less than 2 seconds.

20. A continuous poling process according to claim 18, wherein the width of each pulse is less than 500 milliseconds.

21. A continuous poling process according to claim 18, wherein said plurality of time-spaced pulses is at least four in number.

22. A continuous poling process according to claim 18, wherein said plurality of pulses is at least 10 in number.

23. A continuous poling process according to claim 18, wherein said pulses have a maximum magnitude greater than 1500 K volts/cm.

24. A continuous poling process according to claim 18, wherein said pulses have a maximum magnitude greater than 2500 K volts/cm.

25. A continuous poling process according to claim 24, wherein the electric field in the time-space between said pulses is less than 2400 K volts/cm.

26. A continuous poling process according to claim 18, wherein said plurality of time-spaced electric field pulses are at least four in number, each pulse having a width less than 2 seconds and a maximum magnitude greater than 1500 K volts/cm.

27. A continuous poling process according to claim 26, wherein said pulse has a width less than 500 milliseconds and a maximum magnitude greater than 2500 K volts/cm.

28. A continuous poling process according to claim 18, further including the steps of:

heating said portion concurrent with the establishment of the electric field across said portion; and cooling said portion while said polymeric material has moderate coefficients of at least one of said pyroelectric and piezoelectric properties produced by said electric field.

29. A continuous poling process according to claim 18, wherein said polymeric material is polyvinylidene fluoride.

30. A continuous poling process according to claim 18, wherein applying said electric field having a plurality of time-spaced electric field pulses provides considerable coefficients of at least one of said pyroelectric and piezoelectric properties.

31. A continuous poling process according to claim 18, wherein applying said electric field having a plurality of time-spaced electric field pulses provides substantial coefficients of at least one of said pyroelectric and piezoelectric properties.

32. A process for poling a film of polymeric material to provide at least one of pyroelectric and piezoelectric properties in the film, comprising:

applying an electric field across a portion of the film for a time sufficient to provide at least one of said pyroelectric and piezoelectric properties in said portion; wherein the improvement comprises:

applying an electric field having a plurality of time-spaced electric field pulses across said portion of the film to provide moderate coefficients of at least one of said pyroelectric and piezoelectric properties, the width of each pulse being less than 5 seconds, the spacing between pulses being greater than 100 milliseconds, and the maximum magnitude of each pulse being greater than 1500 K volts/cm.

33. A process according to claim 32, wherein the width of each pulse is less than 500 milliseconds, the spacing between pulses is greater than 500 milliseconds and the maximum magnitude of each pulse is greater than 2500 K volts/cm.

34. A process according to claim 32, wherein said film is polyvinylidene fluoride.

35. A process according to claim 32, wherein applying said electric field having a plurality of time-spaced electric field pulses provides considerable coefficients of at least one of said pyroelectric and piezoelectric properties.

36. A process according to claim 32, wherein applying said electric field having a plurality of time-spaced electric field pulses provides substantial coefficients of at least one of said pyroelectric and piezoelectric properties.

* * * * *